United States Patent
Hillman

[11] Patent Number: 6,036,426
[45] Date of Patent: Mar. 14, 2000

[54] WAFER HANDLING METHOD AND APPARATUS

[75] Inventor: Gary Hillman, Livingston, N.J.

[73] Assignee: Creative Design Corporation, Montville, N.J.

[21] Appl. No.: 08/784,820

[22] Filed: Jan. 17, 1997

Related U.S. Application Data

[60] Provisional application No. 60/010,628, Jan. 26, 1996.

[51] Int. Cl.[7] .................................................. B65G 1/10
[52] U.S. Cl. ............................... 414/331.14; 414/331.18; 414/282; 414/222; 414/935; 414/281; 118/728
[58] Field of Search ...................... 414/281, 282, 414/283, 935, 937, 941, 940, 939, 217, 222, 225, 226, 749, 751, 752, 753, 744, 2, 277, 416, 417, 938, 331.01, 331.14, 331.18; 118/719, 728, 729; 432/239

[56] References Cited

U.S. PATENT DOCUMENTS

| | | |
|---|---|---|
| 4,381,965 | 5/1983 | Maher, Jr. et al. . |
| 4,722,298 | 2/1988 | Rubin et al. . |
| 4,744,715 | 5/1988 | Kawabata . |
| 4,775,281 | 10/1988 | Prentakis . |
| 4,778,331 | 10/1988 | Kimata et al. . |
| 4,886,412 | 12/1989 | Wooding et al. . |
| 4,917,556 | 4/1990 | Stark et al. . |
| 4,955,775 | 9/1990 | Ohkase et al. . |
| 5,054,988 | 10/1991 | Shiraiwa . |
| 5,178,639 | 1/1993 | Nishi . |
| 5,180,273 | 1/1993 | Sakaya et al. . |
| 5,183,370 | 2/1993 | Cruz .......................................... 414/416 |
| 5,207,548 | 5/1993 | Suffel . |
| 5,297,910 | 3/1994 | Yoshioka et al. . |
| 5,314,294 | 5/1994 | Taniguchi et al. . |
| 5,356,261 | 10/1994 | Nishi . |
| 5,364,222 | 11/1994 | Akimoto et al. . |
| 5,397,213 | 3/1995 | Ushiki . |
| 5,399,531 | 3/1995 | Wu .................................... 414/937 XL |
| 5,430,271 | 7/1995 | Orgami et al. . |
| 5,460,478 | 10/1995 | Akimoto et al. ................... 414/416 XL |
| 5,615,988 | 4/1997 | Wiesler et al. .......................... 414/416 |
| 5,697,749 | 12/1997 | Iwabuchi et al. ................. 414/937 XL |

FOREIGN PATENT DOCUMENTS

| | | | |
|---|---|---|---|
| 1119160 | 12/1961 | Germany | ................................ 414/281 |
| 2411415 | 9/1975 | Germany | ................................ 414/281 |
| 24261 | 10/1943 | Japan | ..................... 414/281 |
| 2-082618 | 3/1990 | Japan . | |
| 167538 | 6/1992 | Japan | ..................... 414/935 |

*Primary Examiner*—Frank E. Werner
*Attorney, Agent, or Firm*—Lerner, David, Littenberg, Krumholz & Mentlik, LLP

[57] ABSTRACT

Wafer handling apparatus includes a plurality of holding stations arranged in an upstream-to-downstream order and devices to treat the wafers held at the stations. Cyclically operative wafer shifting devices engage the wafers, simultaneously remove the engaged wafers during that cycle from the holding stations, shift the engaged wafers downstream relative to said holding stations and then simultaneously redeposit the wafers onto the holding stations. Thus, each wafer redeposited on a cycle of the wafer shifting devices is disposed at a holding station downstream from the holding station occupied by such wafer before that cycle of the shifting devices. Wafer supply and removal devices are provided for introducing and removing the wafers to and from the holding stations after they are treated. A method of handling wafers among a plurality of holding stations is also disclosed.

22 Claims, 5 Drawing Sheets

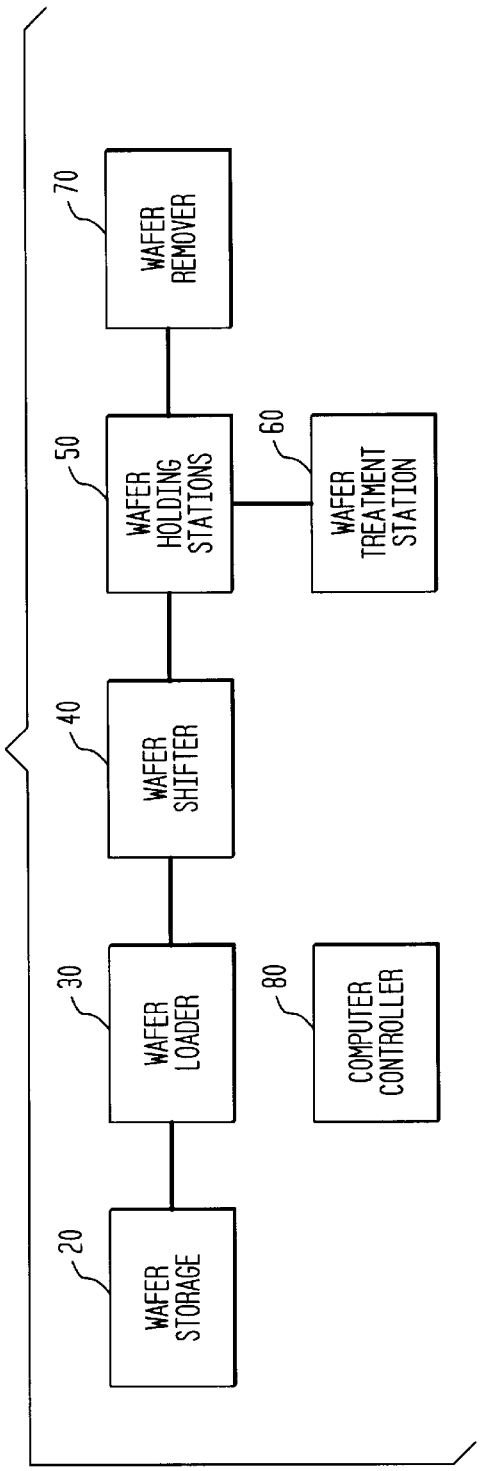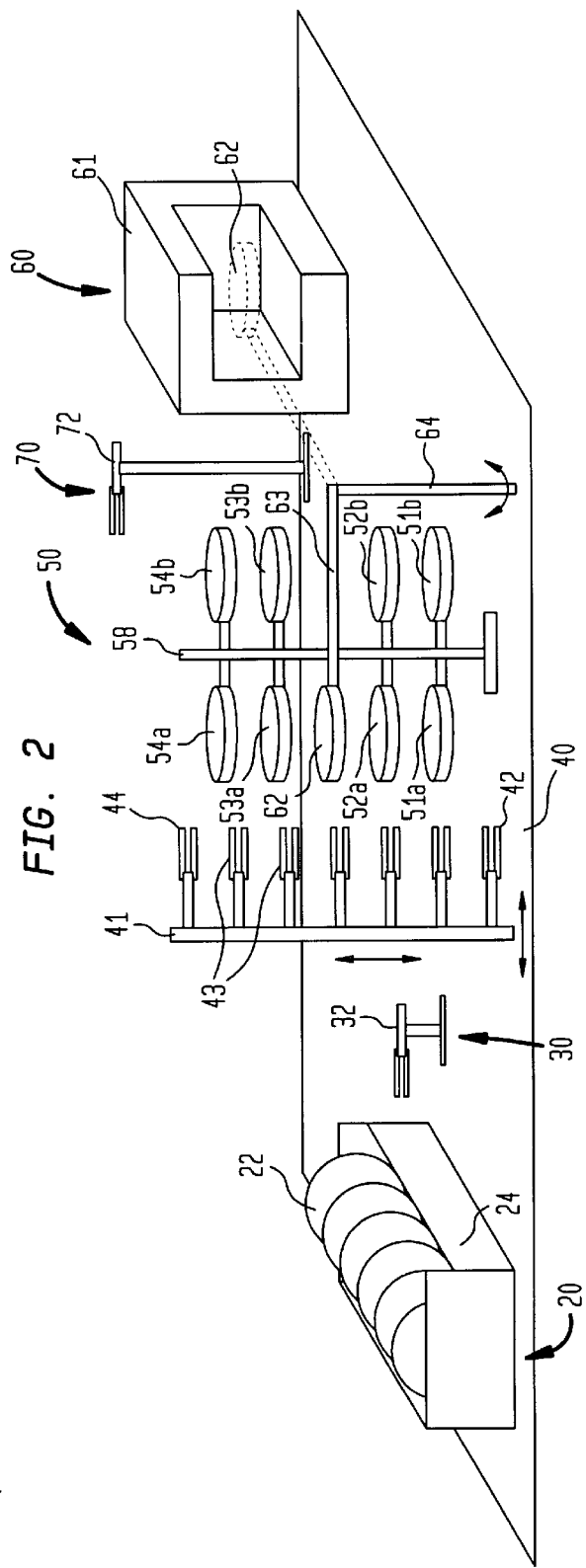

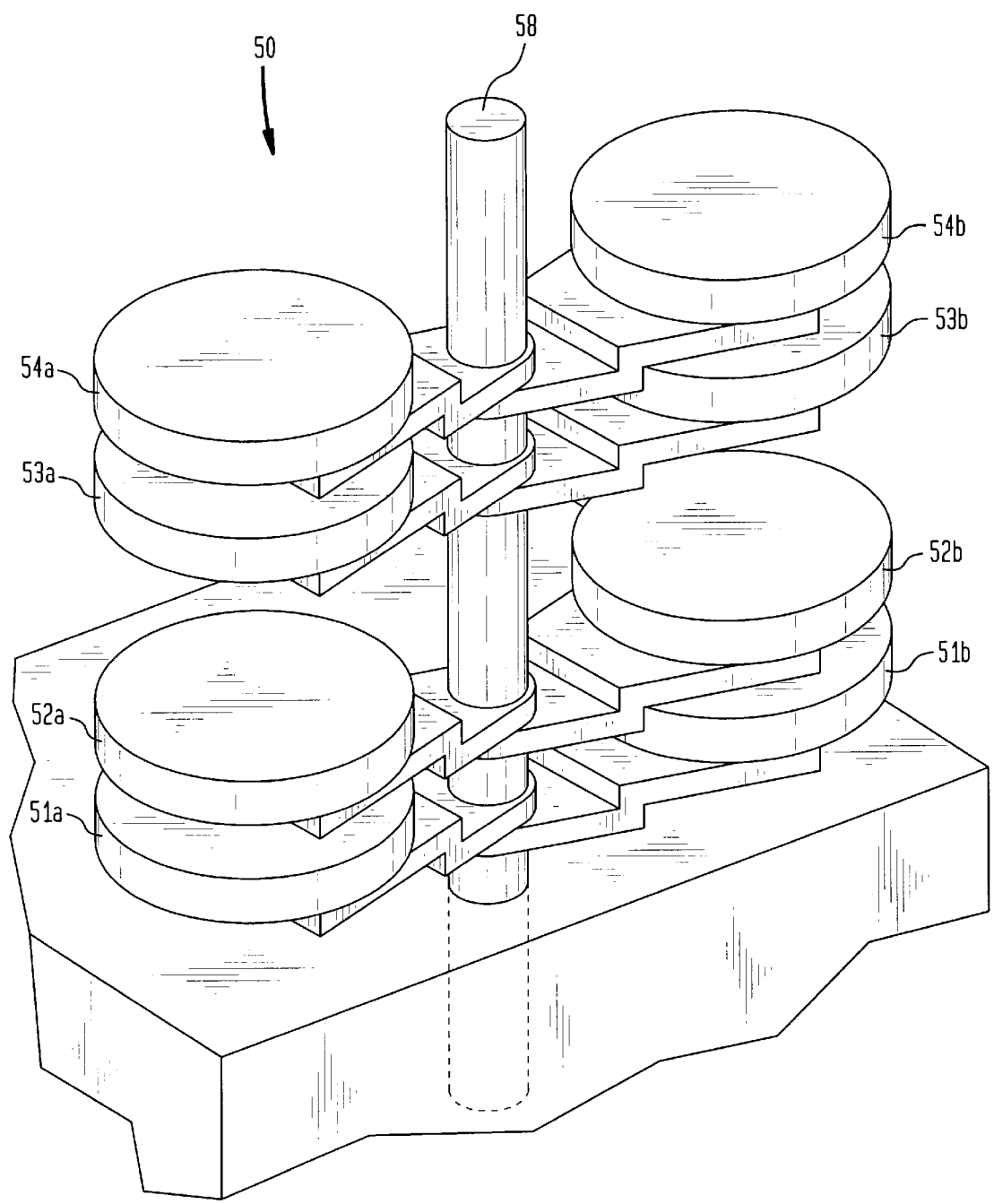

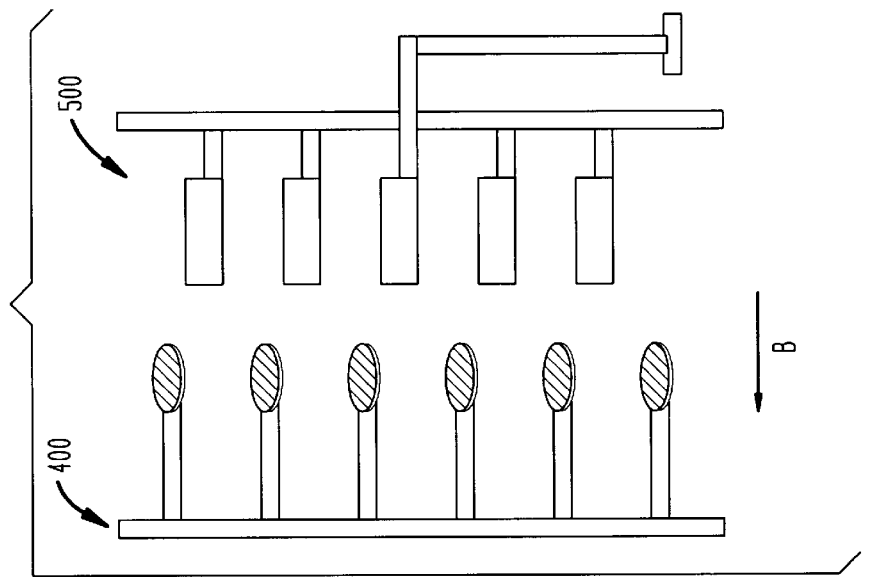
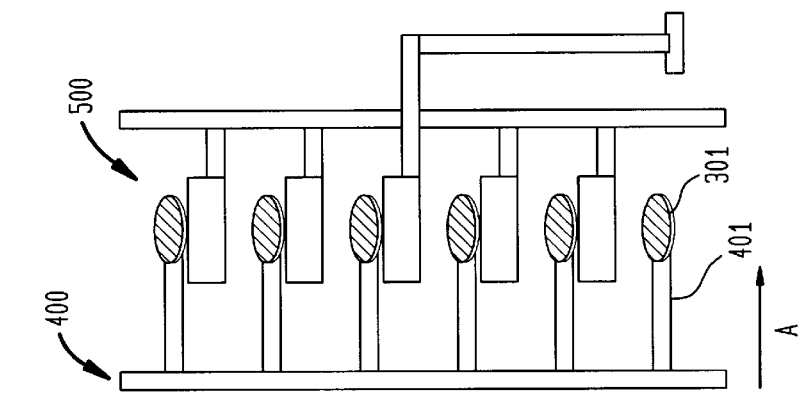
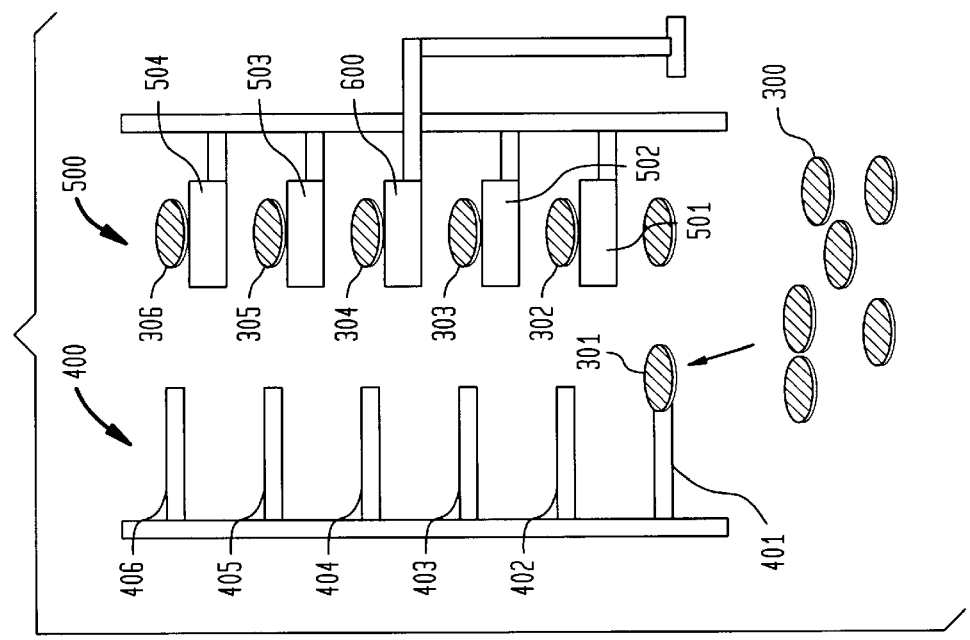

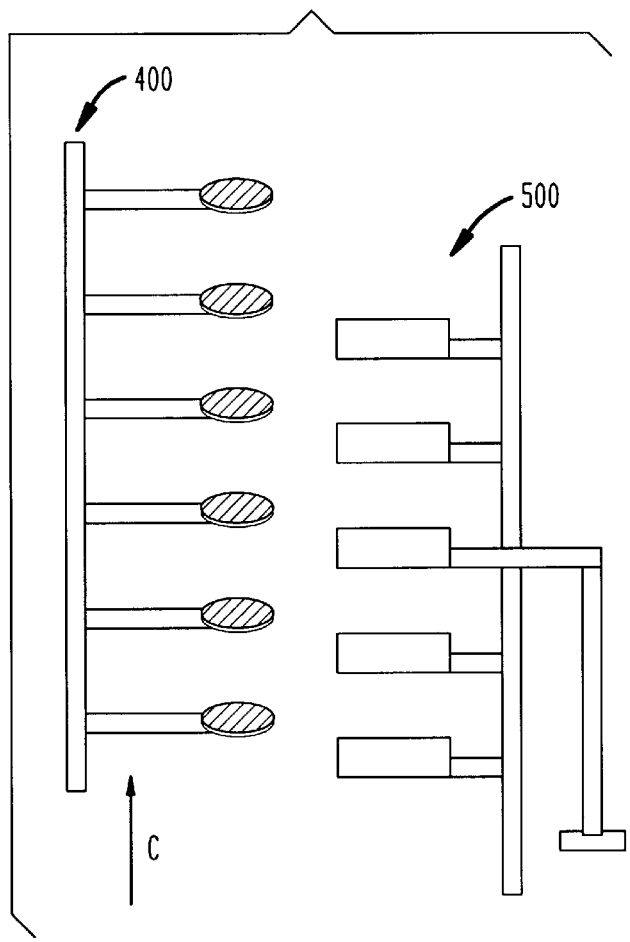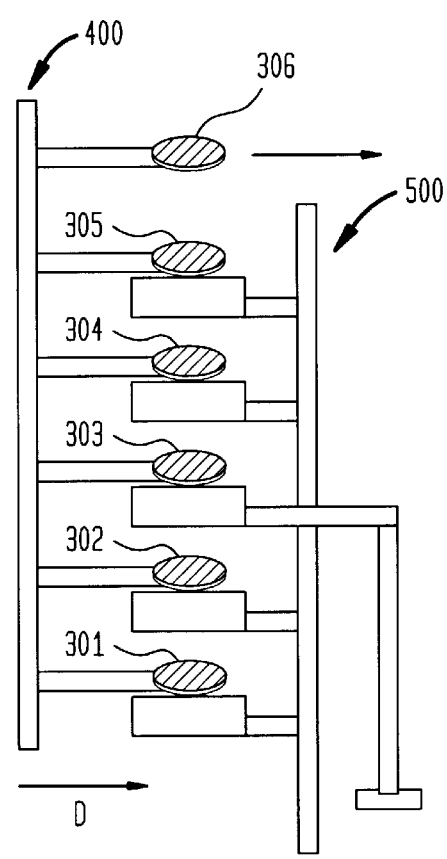

WAFER HANDLING METHOD AND APPARATUS

CROSS-REFERENCE TO RELATED APPLICATION

This application claims the benefit of U.S. Provisional patent application Ser. No. 60/010,628, filed on Jan. 26, 1996, the disclosure of which is incorporated herein by reference.

FIELD OF THE INVENTION

The present invention relates to methods and apparatus for handling wafers such as semiconductor wafers or substrates, and more particularly to such methods and apparatus in which the wafers are treated at simultaneously and transferred among vertically arranged holding stations in a cyclical manner from previous holding stations to subsequent holding stations.

BACKGROUND OF THE INVENTION

The semiconductor and related industries, such as the manufacturers of flat panel displays, must handle the semiconductor wafers or substrates which are to become the final product through many processing operations. While the industry has been able to obtain automatic and robotic systems required to meet its substrate handling needs, it has been able to do so only at high cost and with ever increasing complexity. Additionally, as the substrates become larger in order to provide greater economies of scale in the production process, the equipment has become ever larger. As the production equipment has grown in size the need to provide large ultra-clean manufacturing environments has also increased, which are quite costly. These factors have combined in creating a very significant increase in semiconductor manufacturing costs, which costs are ultimately passed on to the customer, and hence the risks involved in building new production facilities in these substrate processing industries also increase.

A major difficulty in reducing the complexity and the size of the systems heretofore available has been that the wafer handling mechanisms previously provided all have essentially moved the wafer or substrate from process to process sequentially in the horizontal plane. While one or two of process stations may, in some cases, have been disposed in a vertical arrangement in order to reduce the "footprint" of the apparatus, the substantial portion of the wafer handling is still done in the horizontal plane. Furthermore, when the handling architecture of a system is in the horizontal plane the use of a simplified handling means has not been feasible. For this reason, complex robotic "random access" handling means have been employed to move the wafers individually among the process stations.

Still another shortcoming of the prior art handling devices is that most handling systems move one or at most two wafers at a time. The central or even multiple central handling systems cannot by their nature be in two places at once but are constrained to address only one or at most two wafer handling occurrences at a time. In the case of two wafer handling occurrences, wafer handling typically does not occur simultaneously but rather in close time proximity. Therefore, these prior wafer handling techniques have had the effect of increasing the time that the system spends handling the wafers and decreasing the time available for a process system to process the wafers. This is often referred to as handling "overhead" and the greater the handling "overhead", the less productive the system.

Accordingly, it is an object of present invention to provide a wafer handling system which obviates the disadvantages of the prior handling systems, and which is more compact in size enabling a reduction in facilities cost, far simpler enabling an increase in system operational reliability while reducing system cost, and which reduces handling "overhead" time thereby increasing system productivity and throughput.

The foregoing objects, features and various advantages of the present invention will be more readily apparent from the following detailed description of the preferred embodiments set forth below, taken in conjunction with the accompanying drawings.

SUMMARY OF THE INVENTION

One aspect of the present invention provides wafer handling apparatus comprising:

(a) a plurality of holding stations arranged in an upstream-to-downstream order with a first station at the upstream end of the order and a last station at the downstream end of the order;

(b) means for treating wafers held at the stations in accordance with a predetermined treatment process;

(c) cyclically operative wafer shifting means operative in each cycle of operation for (i) engaging the wafers held at a plurality of the holding stations, (ii) simultaneously removing all of the wafers engaged during that cycle from the holding stations at which they are held, (iii) shifting all of the engaged wafers engaged during that cycle downstream relative to the holding stations and then (iv) simultaneously redepositing at least some of the wafers engaged during that cycle onto the holding stations, whereby each wafer redeposited on a cycle of the wafer shifting means is disposed at a holding station downstream from the holding station occupied by such wafer before that cycle of the shifting means; and (d) wafer supply and removal means for introducing wafers to the holding stations and removing the wafers from the holding stations after the wafers are treated.

Preferably, the holding stations are disposed in a vertically stacked arrangement and the wafer shifting means shifts the engaged wafers vertically. The treating means also desirably includes means for treating the wafers at at least some of the holding stations while the wafer remains in position at such holding station, and further includes means for removing the wafers disposed at at least one of the holding stations from such holding station after one cycle of the shifting means to a treatment location. The removed wafers are then treating at the treatment location and returned to such holding station before the next cycle of the shifting means.

The treatment location may comprises a wafer developer station, a wafer coating station and/or a wafer cleaning station. The holding stations may include means for controlling the temperature while the wafers are disposed at the holding stations, and may comprise heating and cooling plates.

In one arrangement, the wafer shifting means comprises a vertical walking beam having a plurality of vertically arranged wafer-handling shelves attached thereto for removing and re-inserting the wafers among the wafer treating stations.

In another preferred aspect, the holding stations may be swingably attached to a vertical support pole and rotatable about the support pole for movement to desired positions about the support pole. The holding stations may also be movable into and out of a vertically stacked arrangement and means for moving the plates to and from the vertically stacked arrangement would then be provided. The holding stations may also comprise two or more sets of holding stations with each of the sets disposed in a vertically stacked arrangement. The sets of holding stations may attached to separate vertical support poles or to a common vertical support pole.

A method of handling wafers among a plurality of holding stations arranged in an upstream to downstream order is also provided. The method comprises the steps of:

(a) providing a plurality of holding stations arranged in an upstream to downstream order;

(b) treating wafers held at the holding stations in accordance with a predetermined treatment process;

(c) cyclically shifting the wafers in each cycle of cyclical operation by (i) engaging the wafers held at a plurality of the holding stations, (ii) simultaneously removing all of the wafers engaged during that cycle from the holding stations at which they are held, (iii) shifting all of the engaged wafers engaged during that cycle downstream relative to the stations and then (iv) simultaneously redepositing at least some of the wafers engaged during that cycle onto the holding stations, whereby each wafer redeposited on a cycle of the wafer shifting means is disposed at a holding station downstream from the holding station occupied by such wafer before that cycle of the shifting means;

(d) supplying the wafers to the holding stations; and (e) removing the wafers from the holding stations after the wafers are treated.

Desirably, the stations are disposed in a vertically stacked arrangement and the step of shifting including shifting the engaged wafers vertically.

In the step of treating the wafers, the wafers may be disposed at at least some of the treating stations while the wafer remains in position at such station. The step of treating may also include removing the wafers disposed at at least one of the holding stations from such holding station after one cycle of the shifting means to a treatment location, treating the removed wafer at such treatment location and returning the removed wafer to such holding station before the next cycle of shifting the wafers. The method may further include the step of developing the wafer at the treatment location.

In one preferred aspect of the method, the step of cyclically shifting the wafers is performed with a vertical walking beam having a plurality of vertically arranged wafer-handling shelves attached thereto for removing and re-inserting the wafers among the wafer treating stations.

A step of controlling the temperature at the holding stations while the wafers are disposed at the stations may also be provided along with the step of moving the holding stations into and out of a vertically stacked arrangement The step of moving the holding stations may further comprises moving one the holding station at a time from a first unstacked position to a second stacked position such that the holding stations form an interleaved vertically stacked arrangement.

BRIEF DESCRIPTION OF THE DRAWINGS

FIG. 1 is a system block diagram of the wafer handling apparatus in accordance with the present invention.

FIG. 2 is schematic perspective view of the wafer handling apparatus of the present invention.

FIG. 3 is a perspective view of the vertical walking beam and vertically stacked holding stations in accordance with a preferred embodiment of the present invention.

FIGS. 6A to 6E are diagrammatic views of portions of the wafer handling apparatus showing the handling of the wafers in accordance with a preferred embodiment of the present invention.

DETAILED DESCRIPTION OF PREFERRED EMBODIMENTS

Figure 4:
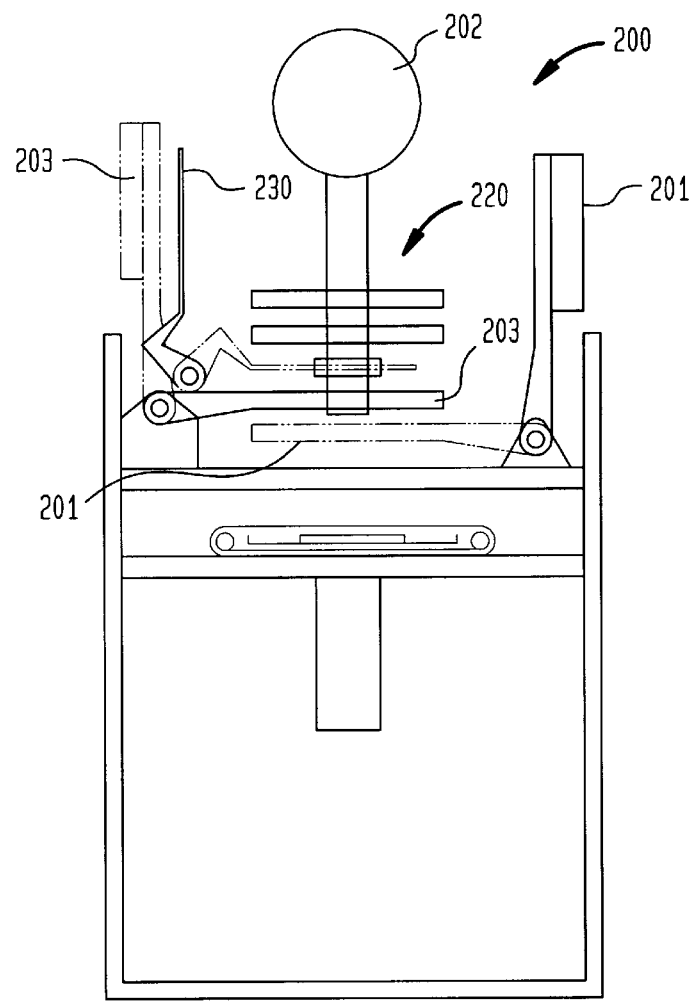
FIG. 4 is a side view of partially interleaved arrangement of holding stations in accordance with another preferred embodiment.

Referring to FIG. 1, there is shown a system block diagram of the wafer handling system of the present invention generally designated as 10. Wafer handling system 10 includes a wafer storage station 20, wafer loader 30, wafer shifter 40, wafer holding stations 50, wafer treatment station 60, wafer remover 70 and computer controller 80.

Referring now to FIG. 2, wafer storage station 20 includes a supply of semiconductor substrates or wafers 22 (hereinafter referred to generically as wafers) which are stored prior to processing. Wafers 22 are stored in a conventional manner such as in wafer cassettes 24 which typically hold a number of wafers per cassette.

Wafer loader 30 is provided for transferring the individual wafers 22 one at a time from the wafer storage station 20 onto wafer shifter 40 (which is described below). Wafer loader 30 preferably comprises a robot transfer arm 32 which can move in the x, y and z directions and rotate about one or more axes to grasp and remove an individual wafer from a wafer cassette 24 and transport the wafer to the wafer shifter 40.

Wafer shifter 40 is provided to engage, shift and redeposit wafers among the wafer holding stations 50, and preferably comprise a vertical walking beam 41 operated under computer control. Vertical walking beam 41 includes a number of wafer holding shelves including a first wafer shelf 42, intermediate wafer shelves 43 and last wafer shelf 44. The wafer shelves 42, 43 and 44 may comprise wafer holding forks, wafer holding "nests" to engage the outer edges of the wafers or may include other types of wafer holders devices such that wafers 22 can be readily moved on and off the shelves and onto the wafer holding stations 50.

Wafer holding stations 50 comprise a plurality of vertically stacked heating and cooling plates, and preferably comprise two or more sets of plates, such as heating plates 51a, 51b, 53a, 53b and cooling plates 52a, 52b, 54a, 54b for heating or cooling a wafer placed thereon for a predetermined treatment time. Preferably, the heating and cooling plates are disposed in a vertically stacked arrangement and are rotatable about vertical support pole 58 such that the wafer shifter 40 can shift wafers among each set of plates when such set of plates is disposed in a shifting position adjacent wafer shifter 40.

Interposed at the holding stations between cooling plate 52a and heating plate 53b is transport plate 62. Transport plate 62 is connected via arm 63 to a vertical support pole 64 which allows the transport plate 62 to be rotated around the support pole 64. Transport plate 62 is provided to remove a wafer which is disposed thereon to a separate treatment station 60 such as spin-coater 61 where the wafer can then undergo a treatment such as being spin-coated to apply a liquid agent to the wafer. After the wafer is treated at treatment station 60, it is then returned to its original holding position between cooling plate 52 and heating plate 53 before the next cycle of shifting the wafers occurs.

Once a wafer has sequentially passed through all desired treatment processes, the wafer can be removed via wafer remover 70, which can comprise a second robot transfer arm 72 for removing wafers after treatment at station 54a or 54b. The treated wafer can then be placed on a conveyor belt or returned to a wafer cassette which holds the processed wafers.

FIG. 3 shows a perspective view of the wafer holding stations 50 in which two sets of heating and cooling plates are provided, including a first set of plates 51a, 52a, 53a and 54a and a second set of plates 5b, 52b, 53b, 54b. Of course, it should be appreciated that only one set of plates can be used or that two or more sets of plates can be used, where balancing the time required for processing makes such additional processing plates appropriate. By providing two sets of heating and cooling plates, for example, the throughput of the system (versus a one set system) can be increased since twice the amount of wafers can be processed. Moreover, by allowing the plates to be rotatable about vertical support pole 58, only one vertical walking beam is needed as each set of plates can be rotated to a holding position adjacent the vertical walking beam for each cycle of wafer shifting.

Figure 5:
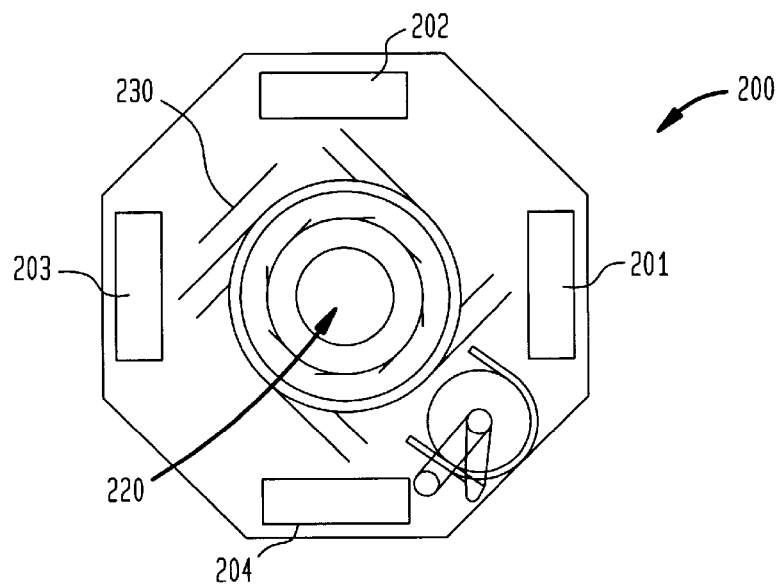
FIG. 5 is a top view of the holding stations of FIG. 4.

FIGS. 4 and 5 show another preferred embodiment of the holding stations that may be used in accordance with the present invention. In this arrangement, a plurality of heating and cooling plates, including heating plates 201 and 203 and cooling plates 202 and 204, and transfer plate 230, are disposed about a central wafer holding area 220. Heating and cooling plates 201, 202, 203 and 204 and transfer plate 230 are movable between an first, unstacked and upright position, for instance the position of heating plate 201 in FIG. 4, and a second, stacked and horizontal position, for instance the position of heating plate 203 in FIG. 4. In order to form the vertically stacked arrangement of plates, the plates are moved one at a time from their first upright position to their second stacked position such that the plates fold sequentially and inwardly over one another so that they are interleaved and form a vertically stacked arrangement Once the vertically stacked arrangement of heating and cooling plates is formed, the vertical walking beam (not shown) can be employed to engage the wafers held at the stacked plates, simultaneously remove the engaged wafers, shift the engaged wafers upwardly (or downwardly as the case may be) relative to the plates, and simultaneously redeposit the wafers onto the next successive plates.

Transfer plate 230 is operative to remove a wafer from the central wafer area 220 to a wafer treatment station (not shown). The wafer can be maintained on transfer plate 230 by suction or other means to retain the wafer as it is moved to the treatment station where the wafer may undergo a coating treatment, for example. The treated wafer is then returned to its original holding position at central wafer holding area 220 before the next cycle of shifting of the wafers.

Turning now to FIGS. 6A through 6E, a complete cycle of shifting the wafers among a single set of vertically arranged holding stations is illustrated. First, as shown in FIG. 6A, unprocessed wafers 300, such as newly introduced wafer 301, are sequentially introduced to the lower shelf 401 of the vertical walking beam 400, which also includes also includes intermediate shelves 401, 402, 403, 404, 405 and upper shelf 406. Vertical walking beam 400 is disposed adjacent from the holding stations, generally designated as 500, which comprise heating plates 501, 503, cooling plates 502, 504 and transfer plate 600. As previously discussed, transfer plate 600 removes a wafer to a separate treatment location such as a wafer developing station and returns the wafer back to original position stacked between plates 502 and 503. Wafers 302, 303, 304, 305 and 306 have already been introduced to the holding stations and is wafer is treated when held at a holding station in accordance with a predetermined treatment process, such as heating, cooling or coating the wafer for a given amount of time.

Next, as shown in FIG. 6B, the vertical walking beam 400 is moved inward toward holding stations 500 in the direction of arrow A to simultaneous remove all of the wafers 302, 303, 304, 305 and 306 from the holding stations at which they were held. At this stage, unprocessed wafer 301 still remains on lower shelf 401.

Next, FIG. 6C shows that vertical walking beam 400, along with unprocessed wafer 301 and the removed wafers 302, 303, 304, 305 and 306, is retracted away from the holding stations in the direction of arrow B. As shown in FIG. 6D, vertical walking beam 400 and all wafers 301, 302, 303, 304, 305 and 306 are next shifted vertically upward in the direction of arrow C. Finally, as shown in FIG. 6E, vertical walking beam 400 is moved in the direction of arrow D and simultaneously redeposits wafers 301, 302, 303, 304 and 305 onto holding stations 501, 502, 600, 503 and 504, respectively. Wafer 306, however, is now fully processed and therefore can be removed from the holding stations while unprocessed wafer 301 has now been introduced to the first holding station 501. This process of engaging, removing, shifting and redepositing the wafers is repeated such that each wafer follows a sequential vertical path (in this case a vertically upward path) from one holding station to the next until each wafer has passed through all of the holding stations, treated at the stations (or treated remote from the stations and reintroduced to the stations) and is removed.

To increase the throughput of the system, one or more additional sets of vertically stacked holding stations can be used. If two such sets are used, for example, after the wafers are shifted among the first set of holding stations, the second set of holding stations can be rotated to the position of the first set (with the first set being rotated away) to allow the vertical walking beam to next shift the second set of wafers on the second set of holding stations as described above. The first and second sets of wafers can then repeatedly transpose positions again for further wafer shifting for both sets of wafers.

It should be appreciated that the wafers need not travel in an upwardly vertical direction as shown in FIGS. 6A through 6E and can travel in a vertically downward direction where new wafers would be introduced to upper shelf 406 of the vertical walking beam 400 and removed from the lower shelf 401. Moreover, the wafers need not travel vertically and can be transferred in a horizontal (or diagonal) path where the holding stations and the walking beam are arranged horizontally (or diagonally). While a horizontal arrangement may not necessarily reduce the overall footprint of the system, a simple walking beam structure can still be utilized thereby increasing efficiency and simplicity of the system and therefor lower overall costs. Where there are multiple sets of holding stations, it is also possible to use two or more walking beam assemblies for the shifting of the wafers. For example, two walking beams can be provided for two sets of holding stations or for four sets of holding stations. Ideally, there should be less walking beams than there are sets of stations to lower costs.

The transfer of the wafers to the wafer loader and to the wafer shifter, along with the shifting and removal of wafers, is preferably performed under a programmable computer control and such programming can be accomplished by one of ordinary skill in the art. To this end, a computer controller 80 can be used which contains a programmable microcomputer, for example, to control the movements of the wafer cassettes, wafer loader, wafer shifter, wafer holding stations, wafer transfer plate and wafer remover. The computer controller can also control the processing of the wafer (such as by regulating temperature, duration of the wafer at each station, etc.) at holding stations 50 and at wafer treatment station(s) 60 in accordance with preset or predetermined treatment processes.

Although the present invention has been described with respect to the handling and treatment of semiconductor wafers or substrates, it should be readily apparent that the present invention can be used for the handling and treating of other objects which required processing among a plurality of processing units. Moreover, although the present invention preferably employs a process whereby wafers are held and treated on heating and cooling plates, other treatment processes and combinations thereof are possible and achievable with the present invention. For instance, enclosed heating and cooling ovens or other temperature application structures can be used in place of the heating and cooling plates described above. In addition, the heating and cooling plates need not be rotatable about a vertical support pole but may be provided in a fixed arrangement. In the case in which the heating and cooling plates are not movable, it is possible to employ a vertical walking beam which can be displaced laterally and/or rotated about its vertical axis to access one or more additional sets of wafer holding stations.

Although one treatment station 60 has been discussed in the context of the present invention, two or more treatment stations such as spin-coaters, wafer developers, wafer cleaners, etc. or other processing stations remote from the wafer holding stations can be employed in accordance with the present invention. In other possible arrangements, remote processing or treatment stations can be incorporated into the vertically stacked holding stations or eliminated from the apparatus if not necessary.

Although the invention herein has been described with reference to particular preferred embodiments, it is to be understood that such embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. Moreover, it will be understood that it is intended that the present invention cover various combinations of the features described herein in addition to those specifically set forth in the appended claims.

What is claimed is:

1. Wafer handling apparatus for cyclically shifting wafers introduced thereto and removed therefrom comprising:

(a) a plurality of vertically arranged holding stations spaced apart from one another each comprising a support surface for supporting the wafers, said holding stations being arranged in an upstream-to-downstream order with a first station at the upstream end of the order and a last station at the downstream end of the order;

(b) a cyclically operative and substantially vertically movable wafer shifting arm for shifting the wafers held at each said holding station among said holding stations during each cycle of operation, said wafer shifting arm comprising vertically arranged wafer holding shelves spaced apart from one another to engage each wafer held at each of said holding stations;

(c) control means for controlling said wafer shifting arm to simultaneously remove each wafer engaged during that cycle and simultaneously redeposit at least some of the wafers engaged during that cycle onto said holding stations such that each wafer redeposited on a said holding station during a cycle is disposed at one of said holding stations downstream from said holding station occupied by such wafer before that cycle; and (d) one or more wafer treatment stations for treating the wafers being shifted among said holding stations in accordance with a predetermined treatment process.

2. Apparatus as claimed in claim 1, wherein said holding stations are disposed in a vertically stacked arrangement and said wafer shifting arm is operative to shift the engaged wafers vertically.

3. Apparatus as claimed in claim 1, wherein at least one of said wafer treatment stations is disposed at at least one of said holding stations in order to treat each wafer while the wafer remains in position at such holding station.

4. Apparatus as claimed in claim 1, wherein at least one of said wafer treatment stations is located remote from said holding stations, and said apparatus further includes a transfer arm controllable by said control means for removing the wafers disposed at at least one of said holding stations from such holding station after one cycle to said remote treatment station and returning the removed wafer to one of said holding stations before the next cycle.

5. Apparatus as claimed in claim 4, wherein said treatment station comprises a wafer developer station.

6. Apparatus as claimed in claim 4, wherein said treatment station comprises a wafer coating station.

7. Apparatus as claimed in claim 4, wherein said treatment station comprises a wafer cleaning station.

8. Apparatus as claimed in claim 1, wherein one or more of said wafer treating stations comprise said holding stations.

9. Apparatus as claimed in claim 8, wherein one or more of said holding stations comprise heating and cooling plates.

10. Apparatus as claimed in claim 1, wherein said holding stations are swingably attached to a vertical support pole and are rotatable about said support pole for movement to desired positions about said support pole.

11. Apparatus as claimed in claim 1, wherein said holding stations are movable into and out of a vertically stacked arrangement and said control means controls the movement of said holding stations to and from the vertically stacked arrangement.

12. Apparatus as claimed in claim 1, wherein said holding stations comprise two or more sets of holding stations with each of said sets disposed in a vertically stacked arrangement.

13. Apparatus as claimed in claim 12, wherein said sets of holding stations are attached to separate vertical support poles.

14. Apparatus as claimed in claim 12, wherein said sets of holding stations are attached to a common vertical support pole.

15. Apparatus as claimed in claim 1, further comprising a wafer supply transfer arm controllable by said control means for introducing wafers to be treated to said holding stations.

16. Apparatus as claimed in claim 1, further comprising a wafer removal transfer arm controllable by said control means for removing wafers from said last station after the wafers are treated.

17. Apparatus as claimed in claim 1, wherein said wafer holding shelves of said shifting arm comprises wafer holding forks.

18. Apparatus as claimed in claim 1, wherein said wafer holding shelves of said shifting arm comprises wafer holding nests to engage the outer edges of the wafers.

19. Wafer handling apparatus for cyclically shifting wafers introduced thereto and removed therefrom comprising:
   (a) a plurality of vertically arranged holding stations spaced apart from one another each comprising means for supporting the wafers, said holding stations being arranged in an upstream-to-downstream order with a first station at the upstream end of the order and a last station at the downstream end of the order;
   (b) cyclically operative and substantially vertically movable wafer shifting means for shifting the wafers among said holding stations during each cycle of operation;
   (c) control means for controlling said wafer shifting means to simultaneously remove each wafer engaged during that cycle and simultaneously redeposit at least some of the wafers engaged during that cycle onto said holding stations such that each wafer redeposited on a said holding station during a cycle is disposed at one of said holding stations downstream from said holding station occupied by such wafer before that cycle; and
   (d) means for treating the wafers being shifted among said holding stations in accordance with a predetermined treatment process.

20. Apparatus as claimed in claim 19, wherein said wafer shifting means further comprises wafer engagement means for engaging each wafer held at each of said holding stations.

21. Wafer handling apparatus for cyclically shifting wafers introduced thereto and removed therefrom comprising:
   (a) a plurality of holding stations spaced apart from one another each comprising a support surface for supporting the wafers, said holding stations being arranged in an upstream-to-downstream order with a first station at the upstream end of the order and a last station at the downstream end of the order;
   (b) a cyclically operative wafer shifting arm having an upstream end and a downstream end corresponding to said upstream-to-downstream order of said holding stations for shifting the wafers held at each said holding station among said holding stations during each cycle of operation, said wafer shifting arm comprising an introductory holding shelf disposed at said downstream end for engaging and introducing new wafers to said wafer shifting arm and a plurality of intermediate wafer holding shelves spaced apart from one another to engage each wafer held at each of said holding stations;
   (c) control means for controlling said wafer shifting arm to simultaneously remove each wafer engaged during that cycle and simultaneously redeposit at least some of the wafers engaged during that cycle onto said holding stations such that said new wafers are deposited on said first station and each wafer redeposited on a said holding station during a cycle is disposed at one of said holding stations downstream from said holding station occupied by such wafer before that cycle; and
   (d) one or more wafer treatment stations for treating the wafers being shifted among said holding stations in accordance with a predetermined treatment process.

22. Apparatus as claimed in claim 21 wherein said wafer shifting arm is substantially vertically movable.

* * * * *

UNITED STATES PATENT AND TRADEMARK OFFICE
CERTIFICATE OF CORRECTION

PATENT NO. : 6,036,426
DATED : March 14, 2000
INVENTOR(S) : Hillman

It is certified that error appears in the above-identified patent and that said Letters Patent is hereby corrected as shown below:

Col. 5, line 9, "5*b*" should read --51*b*--.

Col. 7, line 57, after "supporting" delete "the".

Col. 10, lines 2 and 3, after "supporting" delete "the".

Signed and Sealed this

Twenty-fourth Day of April, 2001

*Attest:*

NICHOLAS P. GODICI

*Attesting Officer*   *Acting Director of the United States Patent and Trademark Office*